(12) United States Patent
Jackson et al.

(10) Patent No.: US 6,426,131 B1
(45) Date of Patent: Jul. 30, 2002

(54) OFF-AXIS PUPIL APERTURE AND METHOD FOR MAKING THE SAME

(75) Inventors: Philip Eric Jackson, Plainsboro, NJ (US); Mario Garza, San Jose; Christopher Neville, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/358,606

(22) Filed: Jul. 21, 1999

Related U.S. Application Data (60) Provisional application No. 60/097,750, filed on Aug. 24, 1998.

(51) Int. Cl.$^7$ .............................. G03F 7/20; G03F 1/16; G03F 1/00; G03F 9/00; H01L 21/027

(52) U.S. Cl. ................. 428/131; 250/492.1; 250/492.2; 430/5; 428/66.6

(58) Field of Search ............................... 428/131, 66.6; 250/492.1, 492.2; 430/5

(56) References Cited

U.S. PATENT DOCUMENTS

| | | | |
|---|---|---|---|
| 4,812,962 A | 3/1989 | Witt ............................. 364/490 |
| 5,208,629 A | * 5/1993 | Matsuo et al. ................. 355/53 |
| 5,475,766 A | 12/1995 | Tsuchiya et al. ............. 382/144 |
| 5,512,394 A | 4/1996 | Levenson et al. ............... 430/5 |
| 5,553,273 A | 9/1996 | Liebmann .................... 395/500 |
| 5,553,274 A | 9/1996 | Liebmann .................... 395/500 |
| 5,670,298 A | 9/1997 | Hur ............................. 430/318 |
| 5,681,674 A | 10/1997 | Fujimoto ........................ 430/5 |
| 5,705,301 A | 1/1998 | Garza et al. .................... 430/5 |
| 5,780,208 A | 7/1998 | Ziger et al. .................. 430/394 |
| 5,973,771 A | * 10/1999 | Hibbs et al. ................. 356/121 |
| 6,249,335 B1 | * 6/2001 | Hirukawa et al. ............. 355/53 |

FOREIGN PATENT DOCUMENTS

| | | |
|---|---|---|
| EP | 2291219 A | 1/1996 |
| EP | 0698916 A3 | 2/1996 |
| EP | 0822452 A3 | 2/1998 |
| JP | 02139426 | 2/1992 |
| JP | 02178008 | 2/1992 |
| JP | 04232103 | 3/1994 |
| JP | 04273199 | 5/1994 |
| JP | 05150734 | 1/1995 |
| JP | 07198770 | 2/1997 |
| JP | 07301155 | 6/1997 |
| JP | 08100471 | 11/1997 |

OTHER PUBLICATIONS

Henderson et al., "CD Data Requirements for Proximity Effect Corrections", 1994, Photomask Technology and Management, SPIE, vol. 2322, pp. 218–228.

(List continued on next page.)

*Primary Examiner*—Shrive P. Beck
*Assistant Examiner*—Elena Tsoy
(74) *Attorney, Agent, or Firm*—Beyer, Weaver & Thomas, LLP (57) ABSTRACT

Disclosed is a pupil aperture, and method for making the pupil aperture for use in a photolithography scanner system. The pupil aperture includes a plate having a set of pole apertures that are radially offset from a reference center point of the plate. The plate further includes a horizontal reference line that intersects the reference center point. The horizontal reference line is used to define a target angle that is between about 15 degrees and about 35 degrees from the horizontal reference line. The target angle defines an off-axis location for each of the set of pole apertures. In a specific aspect of this invention, a set ranging between 3 to 9 pole apertures can be defined in the plate, and their offset from the center point can be selected to be between about 0.3 inches and about 0.9 inches.

28 Claims, 8 Drawing Sheets

OTHER PUBLICATIONS

Stirniman et al., "Optimizing Proximity Correction For Wafer Fabrication Processes", Photomask Technology and Management, SPIE, vol. 2322, pp. 239–246.

Socha et al., "Effects of Wafer Topography on the Formation of Polysilicon Gates", SPIE, vol. 2440, pp. 361–371.

Barouch et al., "Optimask: An OPC Algorithm For Chrome and Phase–Shift Mask Design", SPIE, vol. 2440, pp. 192–206.

Futatsuya et al., "Practical Method of Evaluating Two Dimensional Resist Features For Lithographic DRC", SPIE, vol. 3051, pp. 499–508.

* cited by examiner

FIG._7

OFF-AXIS PUPIL APERTURE AND METHOD FOR MAKING THE SAME

This application claims benefit of Provisional Appln. No. 60/097,750 filed Aug. 24, 1998.

BACKGROUND OF THE INVENTION

1. Field of the Invention

The present invention relates generally to photolithography systems and more particularly, to techniques for designing features of photolithography systems to improve the resolution and focus of an image that is projected onto a semiconductor wafer.

2. Description of the Related Art

Photolithography is an important part of semiconductor technology. Devices made from semiconductor wafers depend greatly on the resolution and focus of images directed onto selected regions of the wafers. Although much improvement has occurred in the development of photolithography systems that enable the fabrication of smaller and smaller features sizes, photolithography engineers continue to battle defects in resolution as geometries continue to decrease.

For example, many of today's photolithography systems are now using deep UV wavelengths (i.e., 248 nm) and deep UV photoresists in efforts to better define the image resolution of patterned photoresist. Unfortunately, it has been observed that many resolution defects occur when feature geometries have angled profiles, with respect to horizontal and vertical features. Consequently, when photoresists are developed after being exposed, only horizontal and vertical feature geometries exhibit good resolution, while angled features are substantially distorted.

Figure 1A:
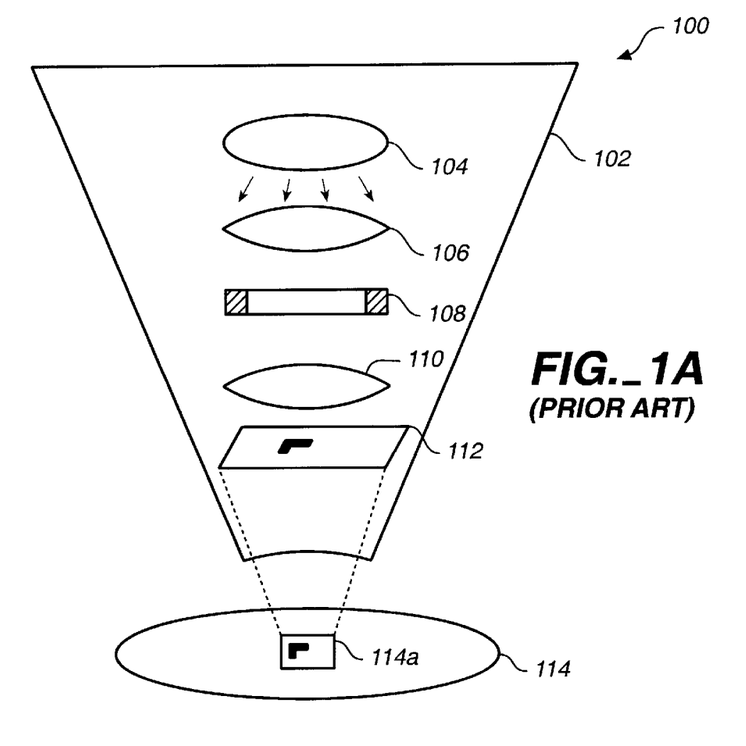
FIG. 1A shows an example of a photolithography system which includes a scanner system.

An example of a photolithography system 100 is shown in FIG. 1A, which includes a scanner system 102. The scanner system 102 is also known as a stepper apparatus. A light source 104 is commonly positioned near a top region of the scanner system 102 in order to allow produced light waves to be directed toward a first lens system 106. From the first lens system 106, the light is projected through a pupil aperture 108 that is used to better direct light onto a second lens system 110. As is well known, the pupil aperture 108 assists in precisely directing the light source onto the desired location of a reticle 112.

The reticle 112 being a glass plate, is patterned with exemplary feature geometries typically defined by a chromium material, which blocks light from propagating through the reticle 112. After the desired light passes through the reticle 112, it leaves the scanner system 102 and comes into contact with a die region 114a of a semiconductor wafer 114 having a photoresist covered surface.

The light then changes the chemical composition of the photoresist so that a developer will allow removal of the exposed regions of photoresist material (i.e., for positive photoresists). In this manner, the feature geometries of the reticle 112 are transferred to the die region 114a. For ease of illustration, only one die region 114a is shown, but as is well known in the art, many more die regions 114a are formed throughout the semiconductor wafer 114 during normal fabrication.

Figure 1B:
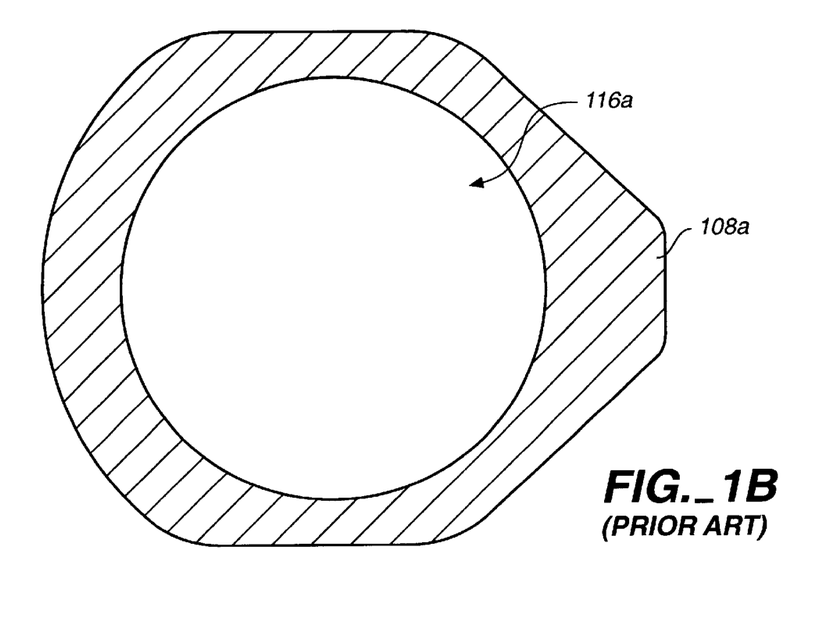
FIG. 1B is a top view of one example of a conventional pupil aperture.

FIG. 1B is a top view of one example of a conventional pupil aperture 108a. The pupil aperture 108a (also known as a clean-up aperture) includes an aperture 116a with a σ value of about 0.6. The pupil aperture 108a is used to more precisely direct light received from the light source 104 onto the reticle 112. Generally, the aperture 116a will define a cone of light that is directed toward the second lens system 110 and then illuminates the reticle 112. Although this pupil aperture 108a assists in more precisely controlling the direction of the light from the light source 104, as demands for smaller and more defined feature resolution continues to increase, the precision provided by the pupil aperture 108a has failed to produce adequate results.

Figure 1C:
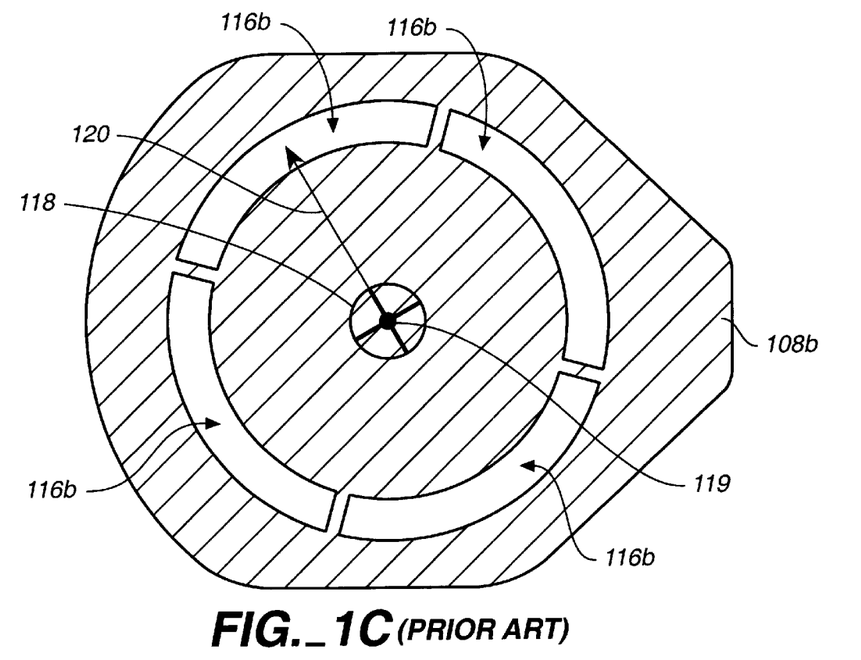
FIG. 1C is a top view of one example of an off-axis pupil aperture.

In order to increase resolution of the pattern printed on the die region 114a, several different pupil aperture designs have been devised. FIG. 1C shows an example of an off-axis pupil aperture 108b. The pupil aperture 108b includes a number of off-axis apertures 116b. For purposes of explanation, a zero order region 118 is shown defined around a center point 119 from which an offset 120 measurement is made to the off axis apertures 116b.

In the pupil aperture 108b, most of the center portion actually blocks the passage of light, thus enabling a focusing of the light that passes through the off-axis apertures 116b. Although the added level of focus precision provided by off-axis apertures is well known, many defects in resolution have still been detected when an off-axis pupil aperture, such as the pupil aperture 108b is used.

Figure 1D:
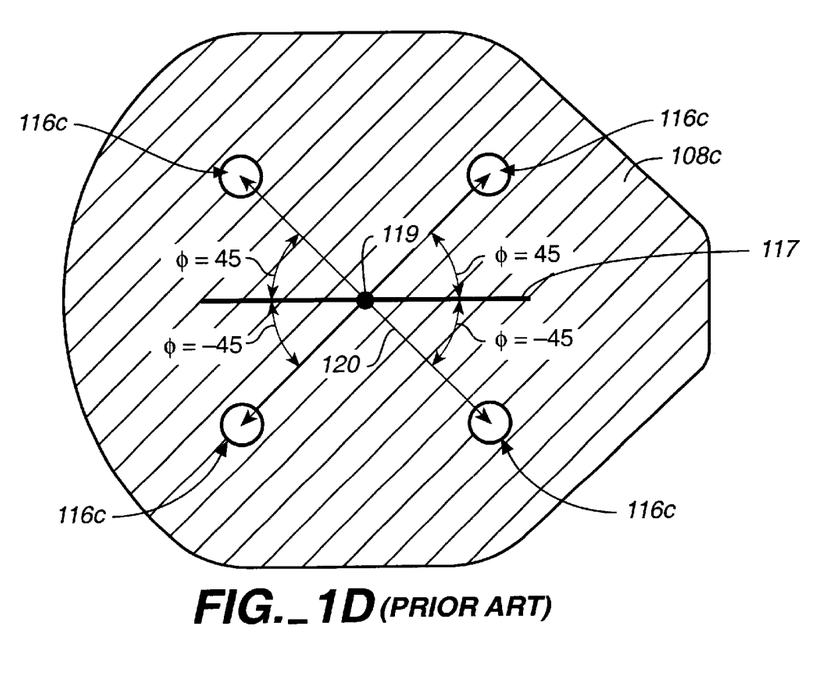
FIG. 1D shows an example of a quadrupolar off-axis pupil aperture.

FIG. 1D shows an example of a quadrupolar off-axis pupil aperture 108c. The pupil aperture 108c includes a set of four pole apertures 116c, each with a σ value of about 0.1. A horizontal axis 117 is defined through the center point 119 of the pupil aperture 108c. The distance between the center point 119 and the pole apertures is defined by an offset 120. The angle between the pole apertures 116c and the horizontal axis 117 is defined by $\phi$, which is strongly suggested by photolithography scanner equipment manufactures to be exactly 45° from the horizontal axis 117.

In fact, scanner equipment manufacturers recommend that when very small feature geometries are being patterned, standard 45° quadrupole pupil apertures be used because light received from the first lens system 106 will be more accurately directed to the second lens system 110 and then to the surface of the reticle 112 (as shown in FIG. 1A). Consequently, the scanner equipment manufacturers provide users of their photolithography equipment with standard machined pupil apertures having the aforementioned 45° quadrupole design.

In addition, some scanner equipment manufacturers, such as Silicon Valley Group, Inc. (SVG) of Wilton, Conn. provide users of their equipment with guidelines for using the standard 45° quadrupole design pupil apertures. Unfortunately, none of the prior art pupil apertures have been able to supply an adequate level of resolution for very small features having angled geometries.

Figure 1E:
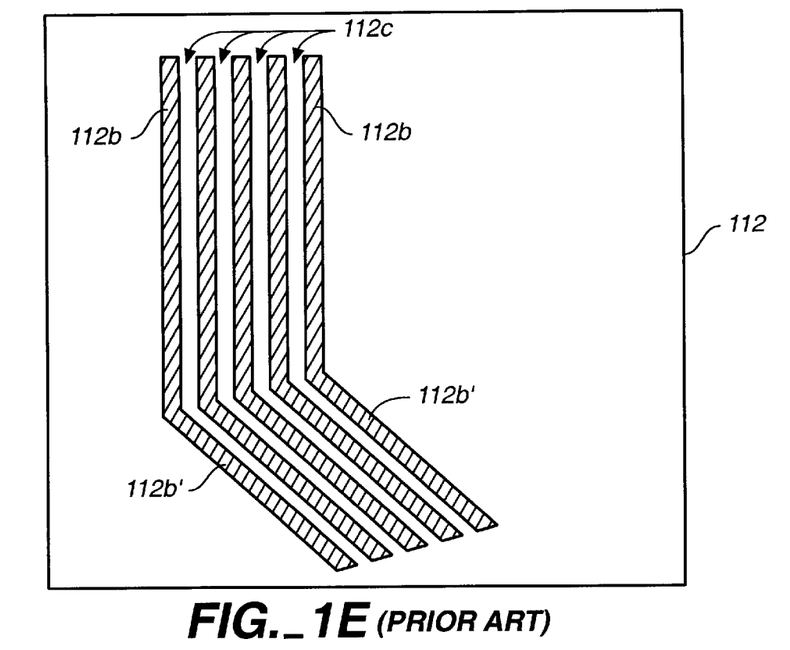
FIG. 1E shows an example of a reticle with a number of feature lines and a corresponding number of angled feature lines patterned on the reticle's glass surface.

FIG. 1E shows an example of a reticle 112 with a number of feature lines 112b and a corresponding number of angled feature lines 112b' patterned on the reticle's glass surface. Also shown are a number of inter-feature spaces 112c defined between any two of the feature lines 112b and its corresponding angled feature lines 112b'. For exemplary purposes, the feature lines 112b/112b' are patterned such that line widths and spaces as small as 160 nm are transferred onto a resist covered die region 114a as shown in FIG. 1F.

As shown, the die region 114a includes a number of photoresist lines 114b and angled photoresist lines 114b' that result after development of the exposed photoresist. As evidenced from numerous experimental trials, the photoresist lines 114b', which have an angled geometric orientation (with respect to a vertical axis), will not produce the ideal pattern shown in the reticle 112.

Figure 1F:
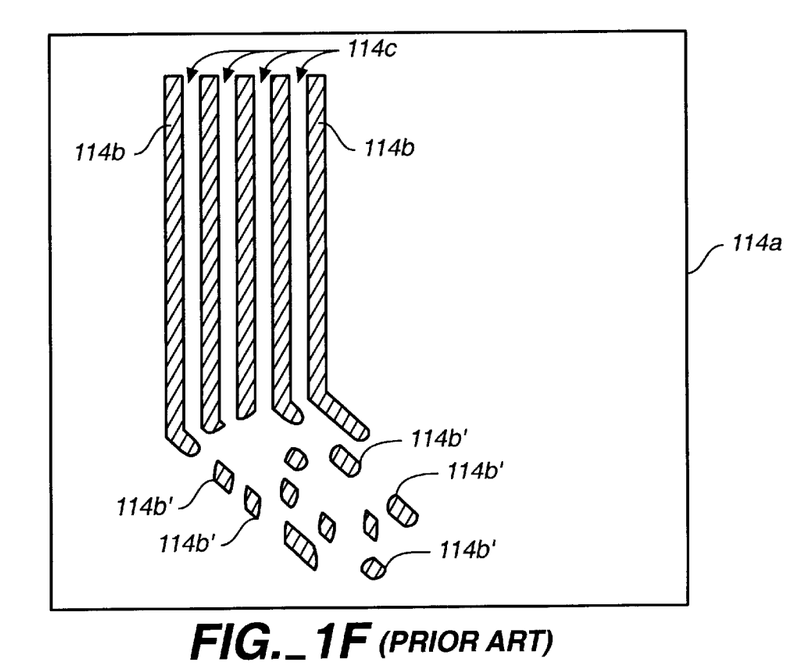
FIG. 1F shows an example of feature lines that are transferred onto a resist covered die region by directing light through any of the prior art pupil apertures and the reticle in FIG. 1E.

In fact, because none of the above-described pupil apertures are able to accurately and precisely direct light onto the surface of the reticle 112 when small geometries are being fabricated, major distortion in the developed photoresist will occur as shown in FIG. 1F. It should also be noted that when such distortion occurs, the feature geometries will not produce the desired electrical interconnections, thereby producing a malfunctioning integrated circuit device. Of course, when such malfunctions occur, semiconductor devices are scrapped, and corresponding fabrication yield will suffer.

In view of the foregoing, there is a need for photolithography scanner pupil apertures that assist in more accurately directing light onto a reticle when features having very small critical dimensions are being patterned. There is also a need for methods for manufacturing custom pupil apertures to correct resolution distortions when features having small angled geometries are patterned over photoresist covered wafers.

SUMMARY OF THE INVENTION

Broadly speaking, the present invention fills these needs by providing an apparatus, and method for making an off-axis pupil aperture for use in a photolithography system. It should be appreciated that the present invention can be implemented in numerous ways, including as a process, an apparatus, a system, a device or a method. Several inventive embodiments of the present invention are described below.

In one embodiment, a pupil aperture for use in a photolithography scanner system is disclosed. The pupil aperture includes a plate having a set of pole apertures that are radially offset from a reference center point of the plate. The plate further includes a horizontal reference line that intersects the reference center point. The horizontal reference line is used to define a target angle that is between about 15 degrees and about 35 degrees from the horizontal reference line. The target angle defines an off-axis location for each of the set of pole apertures. In a specific aspect of this embodiment, a set of 4 or 8 pole apertures can be defined in the plate, and their offset from the center point can be selected to be between about 0.3 inches and about 0.9 inches.

In another embodiment, a pupil aperture for use in a photolithography scanner system is disclosed. The pupil aperture includes a plate having a center region that is semi-transparent. The center region has a set of pole apertures that are radially offset from a reference center point of the center region. The plate further includes a horizontal reference line that intersects the reference center point. The horizontal reference line is used to define a target angle that is between about 15 degrees and about 35 degrees from the horizontal reference line. The target angle defines an off-axis location for each of the set of pole apertures. In a specific aspect of this embodiment, the sigma value for each of the pole apertures can be selected to be between about 0.05 and about 0.15. In a more preferred aspect of this embodiment, a set of 4 or 8 pole apertures can be defined in the plate.

In yet another embodiment, a method for making a pupil aperture for use in a photolithography scanner system is disclosed. The method includes machining a plate having a set of pole apertures that are radially offset from a reference center point of the plate, where the plate has a horizontal reference line that intersects the reference center point. The horizontal reference line is used to define a target angle that is between about 15 degrees and about 35 degrees from the horizontal reference line. The target angle defines an off-axis location for each of the set of pole apertures.

In yet another embodiment, a pupil aperture is disclosed. The pupil aperture includes a disc means having a set of pole aperture means that are radially offset from a reference center point of the disc means. The disc means has a horizontal reference line that intersects the reference center point. The horizontal reference line is used to define a target angle that is between about 15 degrees and about 35 degrees from the horizontal reference line. The target angle defining an off-axis location for each of the set of pole aperture means. Most preferably, the target angle is selected to be about 22.5 degrees from the horizontal reference line.

One advantage of the present invention is that it allows light to be more precisely directed onto a photoresist covered semiconductor wafer. Thus, any major distortions resulting from stray light is eliminated and the pupil aperture is able to improve the resolution of the features being patterned from the reticle to the photoresist. This is particularly powerful when features having very small critical dimensions and angled geometries are being patterned. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

The present invention provides an apparatus and method for designing photolithography scanner pupil apertures that assist in more accurately directing light onto a reticle when features having very small critical dimensions are being patterned. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
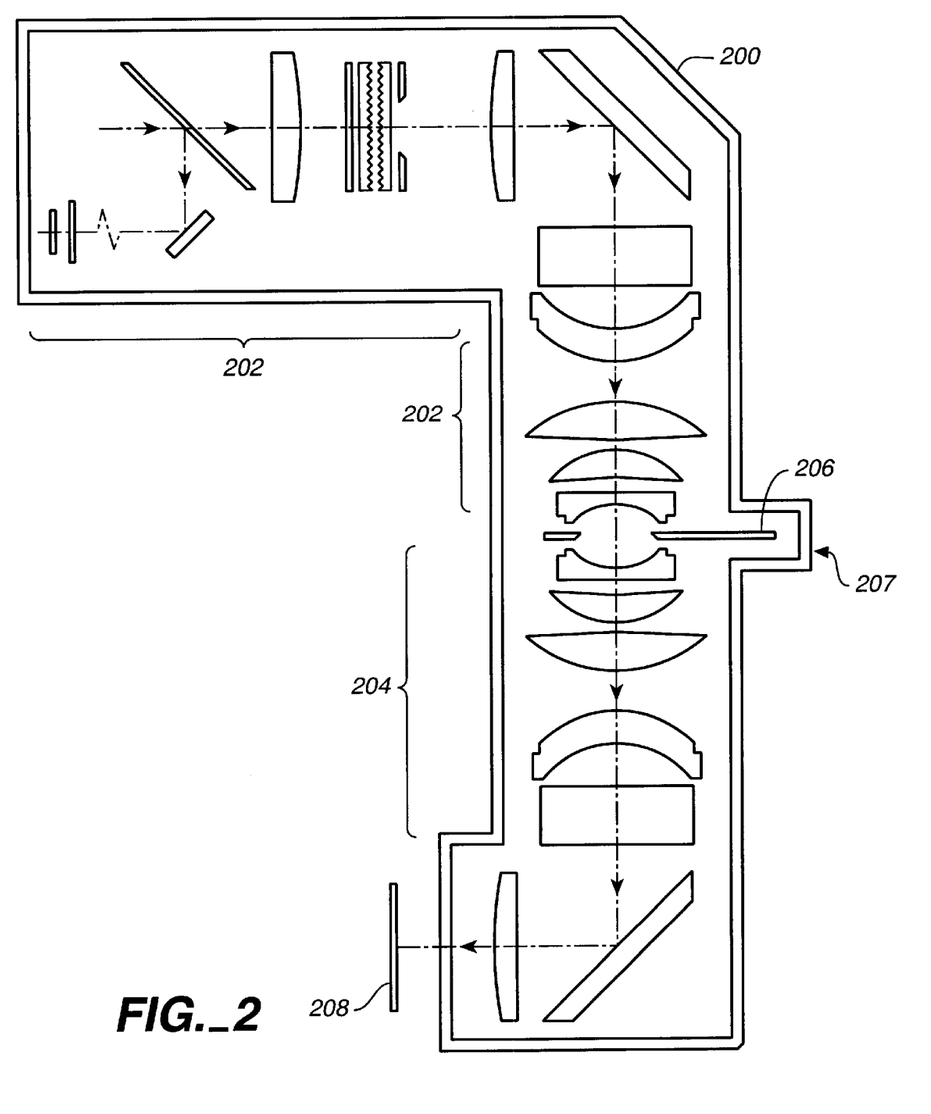
FIG. 2 shows a cross sectional view of an exemplary photolithography scanner system that is configured to receive a pupil aperture in accordance with one embodiment of the present invention.

FIG. 2 shows a cross sectional view of an exemplary photolithography scanner system 200 that is configured to receive a pupil aperture 206 in accordance with one embodiment of the present invention. The scanner system 200 includes a first lens system 202 having components such as a beamsplitter, a condenser lens and a vertical delimiter among other optical components. From the first lens system 202, light is projected through the pupil aperture 206 that is inserted into the scanner system 200 from a side slit 207 receiving region. As is well known, the pupil aperture 206 is used to better direct light onto a second lens system 204. The second lens system 204 then focuses and delivers the light onto a reticle 208.

This scanner system 202 is a simplified representation of a Micrascan III projection optics assembly, which may be obtained from Silicon Valley Group, Inc. (SVG) of Wilton, Conn. Of course, there are many types of scanner systems which also take advantage of pupil apertures to precisely control the projected light waves onto a photoresist covered wafer to improve patterning of small critical dimensions.

Figure 3:
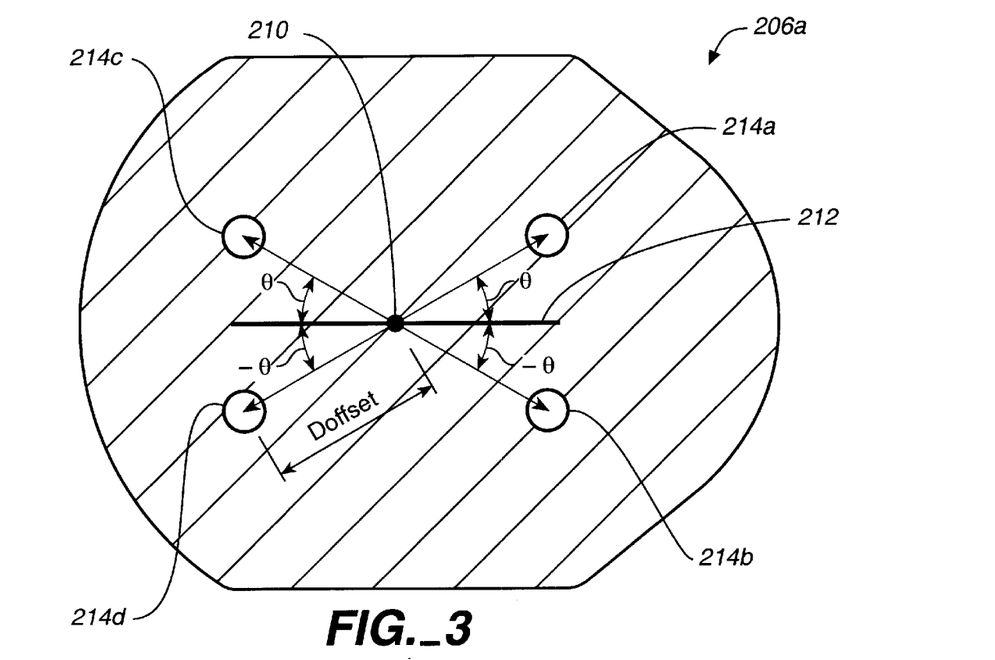
FIG. 3 shows a top view of a quadrupolar rotated off-axis pupil aperture in accordance with one embodiment of the present invention.

FIG. 3 shows a top view of a quadrupolar rotated off-axis aperture 206a in accordance with one embodiment of the present invention. A horizontal axis 212 is defined through a center point 210 of the pupil aperture 206a to assist in defining the preferred location and angles of a set of pole apertures 214. As shown, the pupil aperture 206 includes four pole apertures 214a–214d which are located at a distance $D_{offset}$ from the center point 210. In this embodiment, $D_{offset}$ may be in the range from about 0.3 inches to about 1.2 inches, and more preferably in the range from about 0.3 inches to about 0.9 inches, and most preferably about 0.6 to about 0.8 inches.

To achieve an optimum resolution on the developed photoresist when very small critical dimensions are being patterned, an angle between the pole apertures 214a and 214c from the horizontal axis 212 is defined by θ, and an angle between the pole apertures 214b and 214d from the horizontal axis 212 is defined by −θ. The preferred angle θ is between about 15° and about 35°, and more preferably between about 20° and about 25°, and most preferably about 22.5°.

Also, for the pole apertures 214b and 214d, the preferred angle −θ is between about −15° and about −35°, and more preferably between about −20° and about −25°, and most preferably about −22.5°. The preferred σ value of each of the pole apertures 214a–214d is between about 0.025 and about 0.2, more preferably between about 0.05 and about 0.15, and most preferably about 0.1.

As will be illustrated in greater detail below with reference to FIGS. 6A and 6B, this preferred range of angle ±θ and preferred offset value will generate substantial improvements in the resolution of developed photoresists. Specifically, this improved resolution is maintained even when angled geometries are patterned in complex integrated circuit devices.

In addition, this improvement in resolution is even more important when it is considered that integrated circuit lithography systems continue to use wavelengths in the deep UV range (i.e., 248 nm) and smaller. Of course, the improved resolution of the present invention is also beneficial for systems using I-line (i.e., 365 nm) wavelengths or larger. Consequently, it should be appreciated that this improvement in resolution is a powerful advancement which will continue to enable the fabrication of faster and more dense circuit designs.

Figure 4:
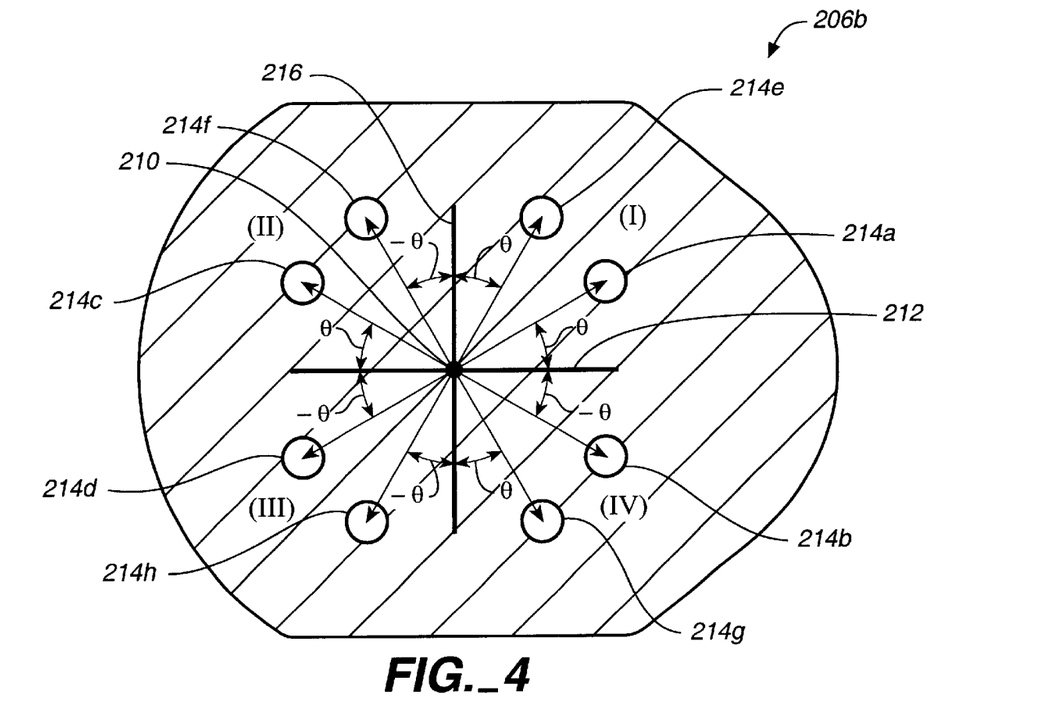
FIG. 4 shows a top view of a eight pole rotated off-axis pupil aperture in accordance with another embodiment of the present invention.

FIG. 4 shows a top view of an eight pole rotated off-axis pupil aperture 206b in accordance with another embodiment of the present invention. A horizontal axis 212 and a vertical axis 216 are defined through a center point 210 of the pupil aperture 206b to assist in defining the preferred locations and angles the pole apertures 214. Quadrants I–IV have been identified to further clarify the relationships between the pole apertures 214 and both axes 212 and 216.

As shown, the pupil aperture 206b of this embodiment has eight pole apertures 214a–214h which are oriented around the center point 210. In other embodiments, more or less poles may be defined, depending on the resolution requirements. An angle between pole apertures 214a and 214c from the horizontal axis 212, and the pole apertures 214e and 214g from the vertical axis 216 is defined by θ. The preferred angle θ for this embodiment is between about 15° and about 35°, and more preferably between about 20° and about 25°, and most preferably about 22.5°.

An angle between the pole apertures 214b and 214d from the horizontal axis 212, and the pole apertures 214f and 214h from the vertical axis 216 is defined by −θ. The preferred angle −θ is between about −15° and about −35°, and more preferably between about −20° and about −25°, and most preferably about −22.5°. The preferred σ value of each of the pole apertures 214a–214h is between about 0.025 and about 0.2, more preferably between about 0.05 and about 0.25, and most preferably about 0.1.

By arranging the pole apertures 214 in the above described angled orientations, each of the quadrants I–IV will contain two pole apertures 214, and a total of eight pole apertures 214 will surround the center point 210. In addition, a preferred $D_{offset}$ to each pole aperture 214 from the center point 210 will be between about 0.5 inches and about 1.2 inches, and more preferably between about 0.6 inches to about 0.9 inches, and most preferably about 0.7 inches.

Again, as will be illustrated in greater detail below with reference to FIGS. 6A and 6B, this preferred range of angle ±θ will generate substantial improvements in the resolution of developed photoresists, particularly with respect to angled geometric patterns in small and complex integrated circuit devices. In some experimental data, it has been observed that the use of the eight pole rotated off-axis pupil aperture 206b can bring additional control to the directing of light onto the photoresists covered wafer, which may better define the resolution of the aforementioned angled geometric patterns.

Figure 5A:
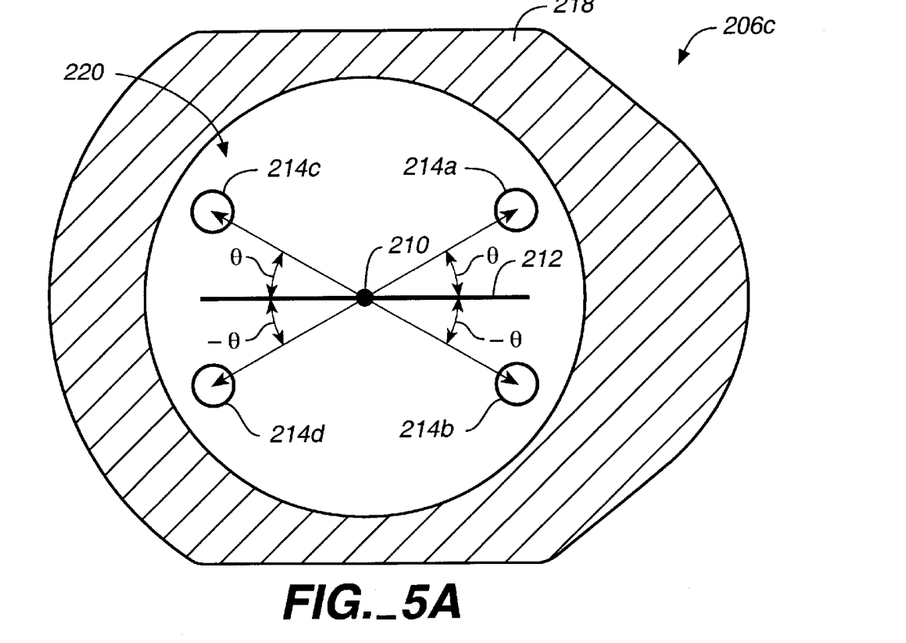
FIG. 5A shows a top view of a quadrupolar rotated off-axis pupil aperture in accordance with another alternative embodiment of the present invention.

FIG. 5A shows a top view of a quadrupolar rotated off-axis pupil aperture 206c in accordance with an alternative embodiment of the present invention. As described above with reference to FIG. 3, the pupil aperture 206c has four pole apertures 214a –214d located at angles θ and –θ from the horizontal axis 212. In this alternative embodiment, a semi-transparent surface 220, which is defined within a stainless steel border 218 of the pupil aperture 206c allows a regulated amount of light to pass through to the photoresist covered wafer in addition to the light that is precisely directed through the pole apertures 214. Of course, other materials besides stainless steel may be used.

Figure 5B:
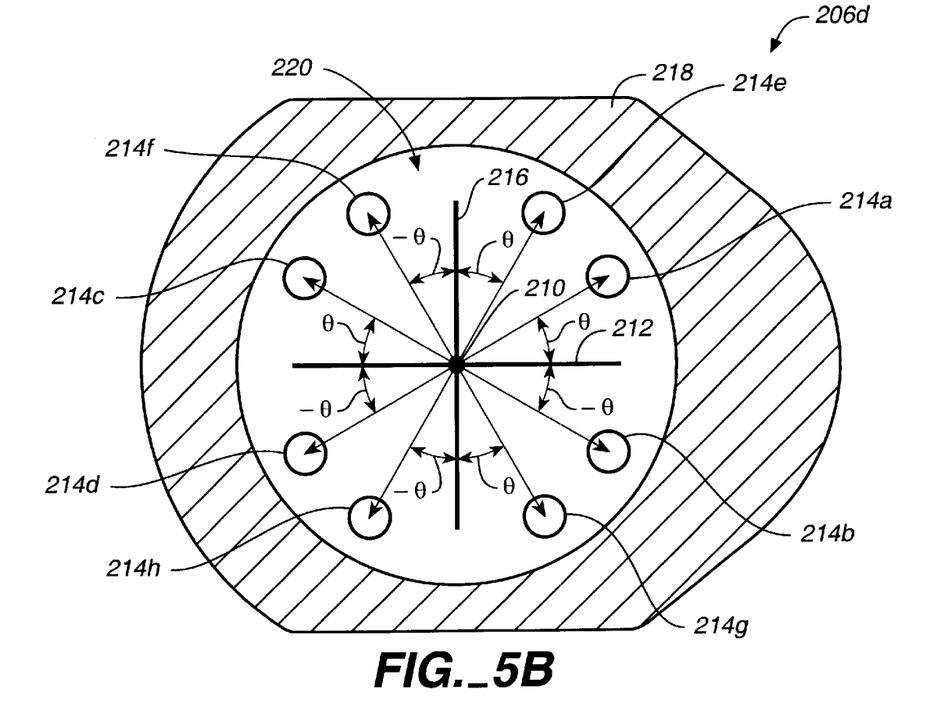
FIG. 5B shows a top view of an eight pole rotated off-axis pupil aperture in accordance with yet another alternative embodiment of the present invention.

FIG. 5B shows a top view of an eight pole rotated off-axis pupil aperture 206d in accordance with yet another alternative embodiment of the present invention. As described above with reference to FIG. 4, the pupil aperture 206d has eight pole apertures 214a –214h located at angles θ and –θ from both the horizontal and the vertical axes 212 and 216. As with the embodiment described above with reference to FIG. 5A, a semi-transparent surface 220, which is defined within the stainless steel border 218 of the pupil aperture 206d allows a regulated amount of light to pass to the photoresist covered wafer in addition to light directed through the pole apertures 214.

With reference to FIGS. 5A and 5B, the semi-transparent surface 220 is yet another advancement which will continue to enable the precise fabrication of smaller, faster, and more dense circuit designs. It is believed that the semi-transparent surface 220 will further enhance the resolution of developed photoresists by presenting additional techniques to better control to the directing of light onto the photoresists covered wafer. Furthermore, it is believed that the alternative embodiments of the present invention may further improve the resolution of complex geometric patterns, including traditionally hard to pattern angled geometries.

Figure 6A:
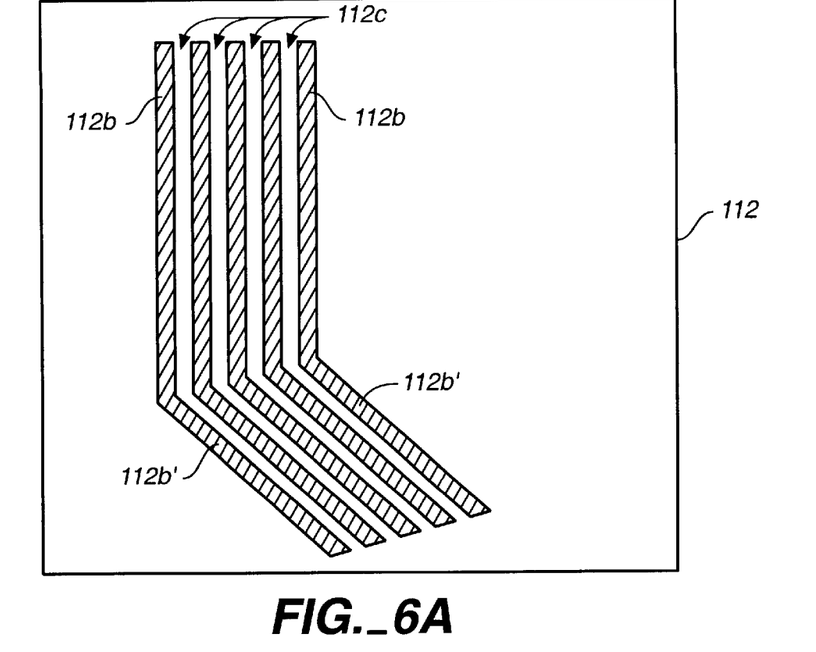
FIG. 6A shows an example of a reticle with a number of feature lines and a corresponding number of angled feature lines patterned on the reticle's glass surface.
Figure 6B:
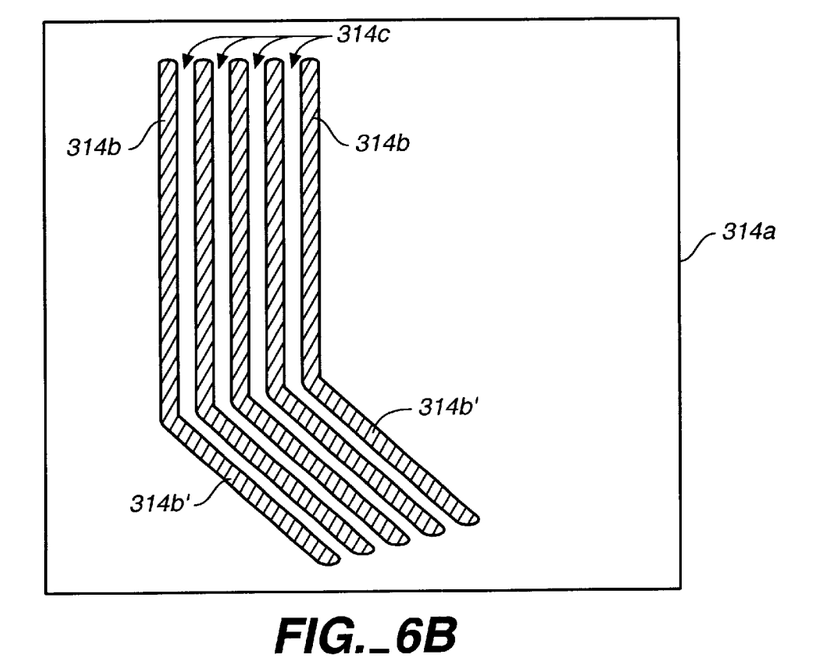
FIG. 6B shows an example of the feature lines that are transferred onto a resist covered die region by directing light through any of the pupil aperture embodiments of the present invention and the reticle in FIG. 6A.

FIG. 6A shows an example of a reticle 112 with a number of feature lines 112b and a corresponding number of angled feature lines 112b' patterned on the reticle's glass surface. Also shown are a number of inter-feature spaces 112c defined between any two of the feature lines 112b and its corresponding angled feature lines 112b'. For exemplary purposes, the feature lines 112b/112b' are transferred onto a resist covered die region 314a as shown in FIG. 6B by directing light through any of the pupil aperture embodiments of the present invention.

As shown, the die region 314a includes a number of photoresist lines 314b and angled photoresist lines 314b' that result after a development of the exposed photoresist. As evidenced from numerous experimental trials, the photoresist lines 314b', which have an angled geometric orientation (with respect to a vertical axis), will produce a nearly identical pattern to the ideal geometric pattern defined on the reticle 112 of FIG. 6A. Because all of the embodiments of the present invention are able to accurately and precisely direct light onto the surface of the reticle 112, all of the major distortions in the developed photoresist of the prior art (shown in FIG. 1F) are essentially eliminated, even when very small geometries are being fabricated.

In one embodiment, the pupil apertures of the present invention have been proven to precisely define photoresist lines 314b/314b' and corresponding spaces having widths that may be as small as about 160 nm or less, without experiencing the aforementioned distortion. Thus, the feature geometries will produce the desired electrical interconnections intended by the manufacturer, and enable the production of a functioning integrated circuit device.

Figure 7:
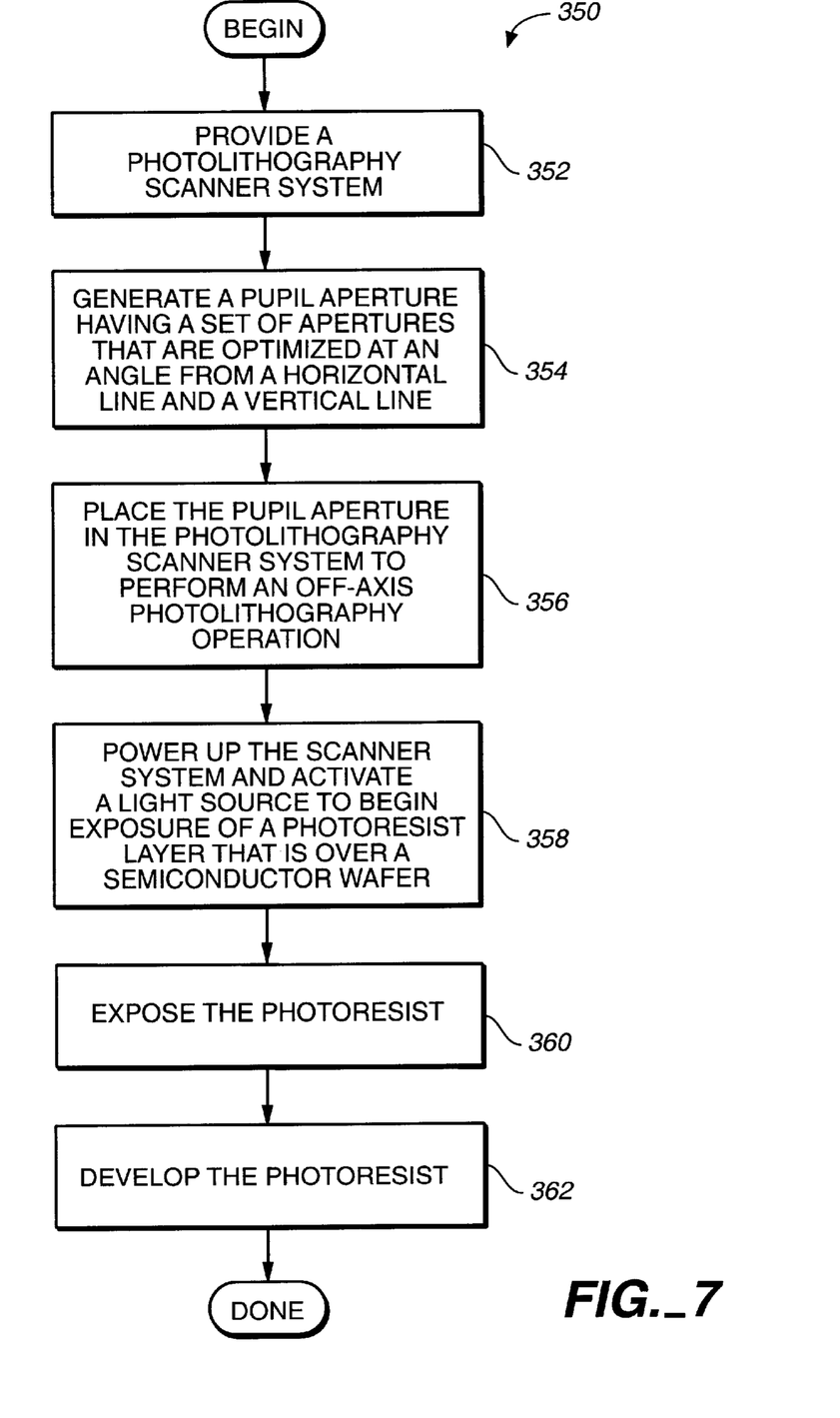
FIG. 7 shows a flow chart encompassing a method for manufacturing custom pupil apertures in accordance with one embodiment of the present invention.

The above described inventions may be further understood with reference to a flow chart presented in FIG. 7. The flow chart encompasses a basic method 350 for manufacturing custom pupil apertures to correct resolution distortions when features having small simple and/or complex geometries (including angled geometries) are being patterned over photoresist covered wafers. The method 350 begins at an operation 352 where a photolithography scanner system is provided. The scanner system, such as SVG's Micrascan III projection optics assembly, typically includes a light source, one or more lens systems, and a reticle.

In operation 354, a pupil aperture having a set of apertures that are optimized at an angle from a horizontal and a vertical line is generated. In one embodiment, the apertures include four pole apertures located at an angle ±θ from the horizontal line. In another embodiment, the apertures include eight pole apertures located at an angle ±θ from either the horizontal or the vertical line. In yet another embodiment, the pupil aperture includes a semi-transparent surface in addition to the set of apertures.

However, it should be noted that any design that includes apertures located at an angle ±θ from either the horizontal or vertical lines will increase the resolution of a pattern printed on a photoresist layer of a semiconductor wafer. As illustrated above with reference to FIGS. 6A and 6B, this preferred range of angle ±θ generates substantial improvements in the resolution of developed photoresists, particularly with respect to angled geometric patterns in small and complex integrated circuit devices.

In operation 356, the pupil aperture is placed in the photolithography scanner system to perform an off-axis photolithography operation. In operation 358, the scanner system is powered up, and a light source is activated to begin exposure of a photoresist layer that is over a semiconductor wafer. The light is directed to the photoresist layer through the lens systems, the pupil aperture and then the reticle. The pupil aperture enables the achievement of an optimum resolution on the developed photoresist when very small critical dimensions are being patterned.

In operation 360, the photoresist is exposed to the light produced by the photolithography scanner system. In operation 362, the photoresist is developed. The pattern that results after development precisely defines photoresist lines and corresponding spaces having widths that may be as small as about 160 nm or less as intended from the feature lines patterned on the reticle.

Although the foregoing invention has been described in some detail for purposes of clarity of understanding, it will be apparent that certain changes and modifications may be practiced within the scope of the appended claims. Of course, it should be understood that the pupil aperture embodiments of the present invention can be used to pattern any type of photoresist, such as, I-line photoresist, deep UV photoresist, etc., and any type of scanner system can be used, irrespective of manufacturer. Accordingly, the present embodiments are to be considered as illustrative and not restrictive, and the invention is not to be limited to the details given herein, but may be modified within the scope and equivalents of the appended claims.

What is claimed is:

1. A pupil aperture for use in a photolithography scanner system, comprising:

a plate having a set of pole apertures that are radially offset from a reference center point of the plate, the plate further having a horizontal reference line that intersects the reference center point, the horizontal reference line being used to define a target angle that is between about 15 degrees and about 35 degrees from the horizontal reference line, the target angle defining an off-axis location for each of the set of pole apertures.

2. A pupil aperture for use in a photolithography scanner system as recited in claim 1, wherein the set of pole apertures includes four pole apertures.

3. A pupil aperture for use in a photolithography scanner system as recited in claim 2, where in the target angle is between about 20 degrees and about 25 degrees from the horizontal reference line.

4. A pupil aperture for use in a photolithography scanner system as recited in claim 3, where the target angle is about 22.5 degrees from the horizontal reference line.

5. A pupil aperture for use in a photolithography scanner system as recited in claim 1, wherein the radial offset is between about 0.5 inches and about 1.2 inches.

6. A pupil aperture for use in a photolithography scanner system as recited in claim 5, wherein the radial offset is between about 0.6 inches to about 0.9 inches.

7. A pupil aperture for use in a photolithography scanner system as recited in claim 5, wherein the radial offset is about 0.7 inches.

8. A pupil aperture for use in a photolithography scanner system as recited in claim 1, wherein each of the set of pupil apertures has a sigma value of between about 0.05 and about 0.15.

9. A pupil aperture for use in a photolithography scanner system as recited in claim 1, wherein the set of pole apertures includes eight pole apertures, and four of the eight pole apertures are defined at the target angle from the horizontal reference line, and four of the eight pole apertures are defined at the target angle from a vertical reference line that intersects the reference center point of the plate.

10. A pupil aperture for use in a photolithography scanner system as recited in claim 9, wherein the target angle is between about 20 degrees and about 25 degrees.

11. A pupil aperture for use in a photolithography scanner system as recited in claim 10, where the target angle is about 22.5 degrees.

12. A pupil aperture for use in a photolithography scanner system as recited in claim 9, wherein the radial offset is between about 0.6 inches to about 0.9 inches.

13. A pupil aperture for use in a photolithography scanner system as recited in claim 12, wherein the radial offset is about 0.7 inches.

14. A pupil aperture for use in a photolithography scanner system as recited in claim 9, wherein each of the set of pupil apertures has a sigma value of between about 0.05 and about 0.15.

15. A pupil aperture for use in a photolithography scanner system, comprising:
a plate having a center region that is semi-transparent, the center region having a set of pole apertures that are radially offset from a reference center point of the center region, the plate further having a horizontal reference line that intersects the reference center point, the horizontal reference line being used to define a target angle that is between about 15 degrees and about 35 degrees from the horizontal reference line, the target angle defining an off-axis location for each of the set of pole apertures.

16. A pupil aperture for use in a photolithography scanner system as recited in claim 15, wherein the set of pole apertures includes four pole apertures.

17. A pupil aperture for use in a photolithography scanner system as recited in claim 16, where the target angle is about 22.5 degrees from the horizontal reference line.

18. A pupil aperture for use in a photolithography scanner system as recited in claim 15, wherein the radial offset is between about 0.6 inches to about 0.9 inches.

19. A pupil aperture for use in a photolithography scanner system as recited in claim 15, wherein each of the set of pupil apertures has a sigma value of between about 0.05 and about 0.15.

20. A method for making a pupil aperture for use in a photolithography scanner system, comprising:
machining a plate having a set of pole apertures that are radially offset from a reference center point of the plate, the plate further having a horizontal reference line that intersects the reference center point, the horizontal reference line being used to define a target angle that is between about 15 degrees and about 35 degrees from the horizontal reference line, the target angle defining an off-axis location for each of the set of pole apertures.

21. A method for making a pupil aperture as recited in claim 20, wherein the machining further includes defining the target angle to be between about 20 degrees and about 25 degrees from the horizontal reference line.

22. A method for making a pupil aperture as recited in claim 20, wherein the machining further includes defining the radial offset to be between about 0.3 inches to about 0.9 inches.

23. A method for making a pupil aperture as recited in claim 20, wherein the machining further includes defining each of the set of pupil apertures to have a sigma value of between about 0.05 and about 0.25.

24. A method of using a pupil aperture as recited in claim 21, further comprising:
inserting the machined plate into a scanner system;
directing a light source through the machined plate to control exposure of a photoresist covered wafer; and
developing the photoresist covered wafer.

25. A pupil aperture, comprising:
a disc means having a set of pole aperture means that are radially offset from a reference center point of the disc means, the disc means further having a horizontal reference line that intersects the reference center point, the horizontal reference line being used to define a target angle that is between about 15 degrees and about 35 degrees from the horizontal reference line, the target angle defining an off-axis location for each of the set of pole aperture means.

26. A pupil aperture as recited in claim 25, wherein the target angle is about 22.5 degrees from the horizontal reference line.

27. A pupil aperture as recited in claim 25, wherein the radial offset is between about 0.3 inches to about 0.9 inches.

28. A pupil aperture as recited in claim 25, wherein each of the set of pupil aperture means has a sigma value of between about 0.05 and about 0.25.

* * * * *